(12) United States Patent
Tanaka et al.

(10) Patent No.: US 7,097,914 B2
(45) Date of Patent: Aug. 29, 2006

(54) COMPOSITE STRUCTURAL MATERIAL, AND METHOD OF PRODUCING THE SAME

(75) Inventors: Katsufumi Tanaka, Kariya (JP); Tomohei Sugiyama, Kariya (JP); Kyoichi Kinoshita, Kariya (JP); Takashi Yoshida, Kariya (JP); Eiji Kono, Kariya (JP); Hidehiro Kudo, Kariya (JP); Manabu Miyoshi, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 10/472,273

(22) PCT Filed: Aug. 28, 2002

(86) PCT No.: PCT/JP02/08640

§ 371 (c)(1),
(2), (4) Date: Sep. 17, 2003

(87) PCT Pub. No.: WO03/021669

PCT Pub. Date: Mar. 13, 2003

(65) Prior Publication Data

US 2004/0101707 A1 May 27, 2004

(30) Foreign Application Priority Data

Aug. 28, 2001 (JP) ............................... 2001-257951
Jul. 5, 2002 (JP) ............................... 2002-197716

(51) Int. Cl.
*B32B 3/24* (2006.01)
*B32B 15/06* (2006.01)
*H01L 23/36* (2006.01)

(52) U.S. Cl. .................. 428/609; 428/209; 428/307.3; 428/614; 428/625; 257/720; 361/710; 361/713; 156/60; 29/505

(58) Field of Classification Search ............... 428/609, 428/614, 596, 620, 675, 676; 164/111, 98; 228/235.2, 190; 257/720
See application file for complete search history.

(56) References Cited

U.S. PATENT DOCUMENTS

| 2,121,469 A | * | 6/1938 | Vass .............................. 29/6.2 |
| 3,399,332 A | | 8/1968 | Savolainen ................. 317/234 |
| 4,283,464 A | | 8/1981 | Hascoe ....................... 428/594 |

(Continued)

FOREIGN PATENT DOCUMENTS

JP 53-145567 * 12/1978

(Continued)

OTHER PUBLICATIONS

Translation of Japanese publication 07-249717, published Sep. 1995, 11 pages.*

(Continued)

*Primary Examiner*—John J. Zimmerman
(74) *Attorney, Agent, or Firm*—Morgan & Finnegan, LLP

(57) ABSTRACT

A plate-shaped composite material has a first member and a second member. The first member is an expanded metal formed of a metal plate. The coefficient of linear expansion of the metal plate is less than or equal to $8\times10^{-6}$/degrees Celsius. The first member suppresses thermal expansion of the composite material. The coefficient of thermal conductivity of the second member is greater than or equal to 200 W/(m×K). The second member maintains the coefficient of thermal conductivity of the composite material. This structure provides a reliable coefficient of thermal conductivity and high strength. The structure is suitable for a cooling substrate on which electronic elements such as semiconductors are mounted.

4 Claims, 9 Drawing Sheets

U.S. PATENT DOCUMENTS

| | | | |
|---|---|---|---|
| 4,427,993 A | | 1/1984 | Fichot et al. ............... 357/81 |
| 5,151,777 A | | 9/1992 | Akin et al. ................. 357/81 |
| 5,358,795 A | * | 10/1994 | Nakamura et al. ......... 428/614 |
| 5,506,062 A | * | 4/1996 | Flammang ................. 428/614 |
| 5,874,178 A | * | 2/1999 | Takayasu ................... 428/681 |
| 6,045,927 A | * | 4/2000 | Nakanishi et al. ......... 428/614 |
| 6,074,764 A | * | 6/2000 | Takayasu ................... 428/594 |
| 2004/0142202 A1 | * | 7/2004 | Kinoshita et al. .......... 428/596 |

FOREIGN PATENT DOCUMENTS

| | | | |
|---|---|---|---|
| JP | 55-159967 | | 7/1980 |
| JP | 55-162249 | * | 12/1980 |
| JP | 57-112059 | | 12/1982 |
| JP | 03-227621 | | 10/1991 |
| JP | 05-109947 | | 4/1993 |
| JP | 05-136286 | | 6/1993 |
| JP | 06-077365 | | 3/1994 |
| JP | 06-268027 | | 9/1994 |
| JP | 06-334074 | | 12/1994 |
| JP | 07-249717 | | 9/1995 |
| JP | 08-196421 | | 8/1996 |
| JP | 09-001361 | | 1/1997 |
| JP | 10-173109 | | 6/1998 |
| WO | WO 95/02505 | * | 1/1995 |

OTHER PUBLICATIONS

Webster's New Collegiate Dictionary, 1977, "diamond", "rhombus", pp. 314, 994.*

* cited by examiner

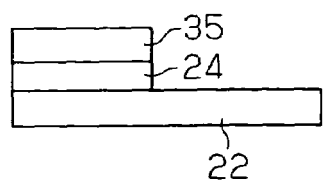
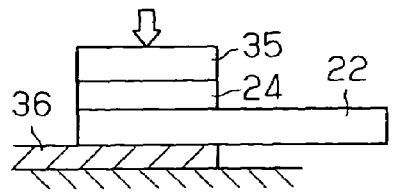
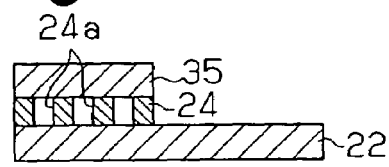
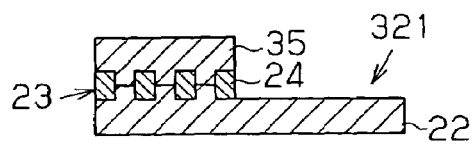
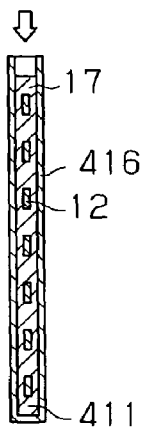
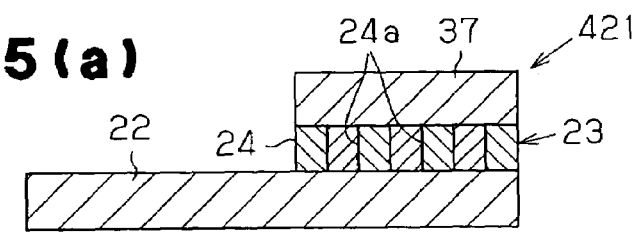
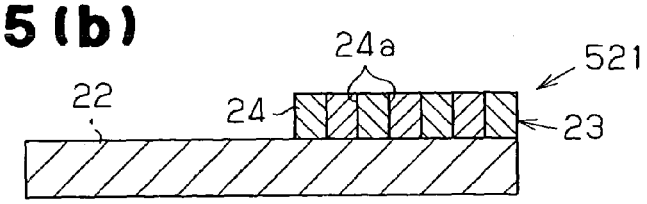

Fig.18 (Prior Art)
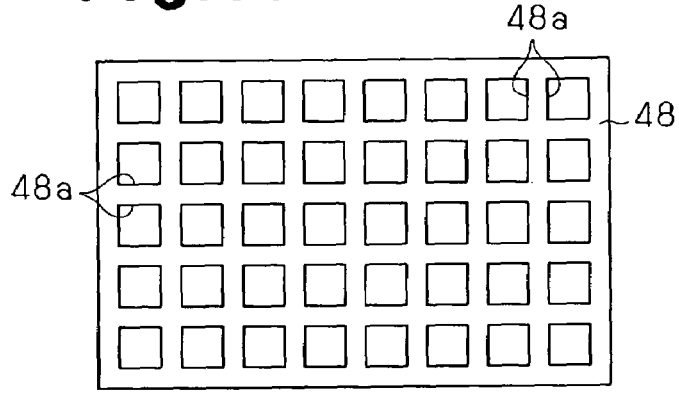
Fig.19 (Prior Art)
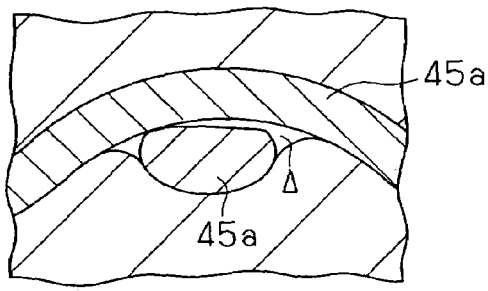
Fig.20 (a) (Prior Art)
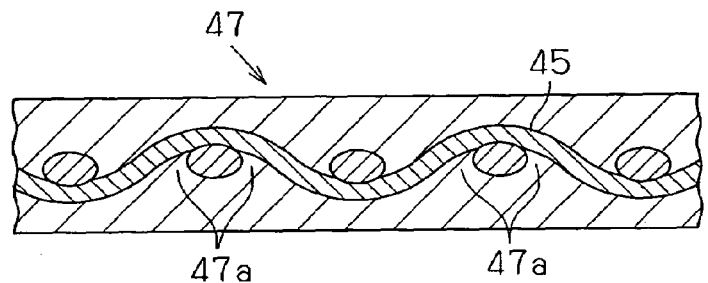
Fig.20 (b) (Prior Art)
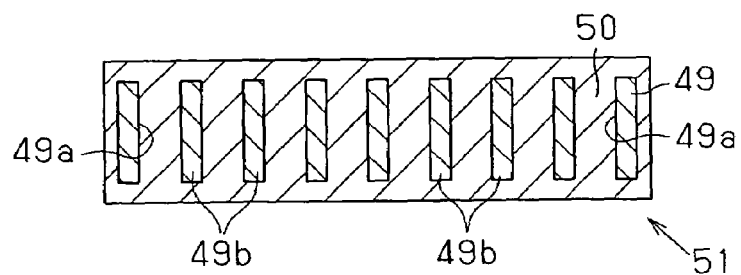

COMPOSITE STRUCTURAL MATERIAL, AND METHOD OF PRODUCING THE SAME

BACKGROUND OF THE INVENTION

The present invention relates to a composite material and a manufacturing method of the composite material. More specifically, the present invention pertains to a composite material that is suitable for a cooling substrate on which electronic elements, such as semiconductors, are mounted, or a composite material that is suitable for wiring material of semiconductors. The present invention also pertains to manufacturing methods of the composite materials.

Typical electronic elements such as semiconductors generate heat when supplied with electric current. The electronic elements are cooled to prevent the performance from deteriorating.

Packaging methods of a semiconductor include the use of a heat sink. FIG. 16 shows an aluminum base 41, which constitute a casing, and a heat sink 42, which is secured to the aluminum base 41 by screws (not shown) or by soldering. An insulated-substrate 43 is secured to the heat sink 42 by soldering. The insulated-substrate 43 has metal (Al) layers 43a on both sides. An electronic element 44, such as a semiconductor, is mounted on one of the metal layers 43a of the insulated-substrate 43 by soldering. The insulated-substrate 43 is made of aluminum nitride (AlN). The heat sink 42 uses material having low coefficient of thermal expansion and high coefficient of thermal conductivity. The material may be metal matrix composite material having a metal matrix phase to which ceramics are dispersed. The metal matrix composite material may be, for example, an aluminum substrate to which silicon carbide (Sic) particles are dispersed.

The metal matrix composite material used for the heat sink 42 is expensive and has low workability. Therefore, a different cooling substrate that is inexpensive and has high workability has been proposed. For example, Japanese Laid-Open Patent Publication No. 6-77365 discloses a cooling substrate 47, which is integrally formed with metal plates 46 and a wire fabric 45 as shown in FIGS. 17(a) and 17(b). The metal plates 46 are made of copper, copper and tungsten, or copper and molybdenum. The wire fabric 45 is woven with thin metal wires made of molybdenum or tungsten. The metal plates 46 are laid on one another with the wire fabric 45 arranged in between. In this state, the metal plates 46 and the wire fabric 45 are heated and rolled. This integrates the metal plates 46 and the wire fabric 45 and forms a laminated sheet of the cooling substrate 47.

Japanese Laid-Open Patent Publication No. 7-249717 discloses a cooling substrate that is formed by integrating a wire fabric made of thin metal wires of molybdenum or tungsten with impregnant containing copper, copper and tungsten, or copper and molybdenum.

Japanese Laid-Open Patent Publication No. 6-334074 discloses a substrate for semiconductors as shown in FIG. 18. The substrate includes a base material 48, in which holes 48a are formed. The base material 48 is made of metal or alloy, the coefficient of thermal expansion of which is less than or equal to $8 \times 10^{-6}$/degrees Celsius. The holes 48a are filled with highly thermal conductive material made of metal or alloy, the coefficient of thermal conductivity of which is greater than or equal to 210 W/(m×K). The highly thermal conductive material may be Cu, Al, Ag, Au or an alloy that mainly includes Cu, Al, Ag, or Au. The base material 48 may be an invar alloy, which contains 30 to 50% Ni by weight and Fe making up the remaining proportion, or a super invar alloy, which includes Co. The holes 48a of the base material 48 are made by punching after processing the raw material into flat shape, or the holes 48a are formed during casting by the precision casting (lost-wax process).

In a semiconductor, a silicon chip (silicon element) needs to be connected to other electrode directly or via a pad located on the silicon chip with wiring. In general, wiring material, such as aluminum wire, is used for wiring. However, when the wiring material is used, the element might be damaged during wire bonding. Further, when the temperature is increased due to heat generation during operation of the semiconductor, joint portions might be deteriorated or disconnected by the thermal stress caused by the difference between the thermal expansion of the wire and the silicon element.

To solve the above mentioned problem, Japanese Patent Publication No. 3216305 discloses a semiconductor having bonding pads. The bonding pads are located on a semiconductor layer, which serves as an active region of a semiconductor element. The bonding pads are electrically connected to electrodes outside the silicon element. The bonding pads of the semiconductor are connected to each other with plate-shaped conductive members.

When the cooling substrate 47 shown in FIG. 17(b) is rolled, spaces Δ are easily formed at portions where the thin metal wires 45a of the wire fabric 45 overlap with each other and in the vicinity of the overlapped portions as shown in FIG. 19, which is an enlarged partial cross sectional view of FIG. 17(b). As a result, air in the space Δ deteriorates the heat conductivity. Also, cracks are easily formed in the wire fabric 45 at the spaces Δ by the repeated thermal expansion and thermal contraction, which reduces the strength. To improve the strength of the wire fabric 45, the contact points of the thin metal wires 45a may be welded. However, it is difficult to weld the contact points of the wire fabric 45, since the wire fabric 45 is woven with the thin metal wires 45a and has fine mesh.

FIG. 20(b) illustrates a cooling substrate 51 according to another prior art. The cooling substrate 51 includes a flat metal plate 49. The metal plate 49 includes partitions 49b, which are arranged at predetermined intervals. Holes 49a are defined between the adjacent partitions 49b. The metal plate 49 is covered with a metal 50, which has higher coefficient of thermal expansion than the metal plate 49.

It is required to maximize the volumetric proportion of metal having low coefficient of thermal expansion to suppress the coefficient of thermal expansion of the cooling substrate. To suppress the coefficient of thermal expansion of the cooling substrate 47 shown in FIGS. 17(a), 17(b), 19, and 20(a), the wire fabric 45, which is woven with the thin metal wires 45a having low coefficient of thermal expansion, is used. However, when rolling, the metal plates 46, which have higher coefficient of thermal expansion than the thin metal wires 45a, cover the wire fabric 45 and enter portions 47a (see FIG. 20(a)) that correspond to bent portions of the thin metal wires 45a in addition to the meshes of the wire fabric 45. On the other hand, in the case with the cooling substrate 51 shown in FIG. 20(b), the metal 50 enters the holes 49a that correspond to the mesh of the wire fabric 45 shown in FIG. 20(a) and around the longitudinal ends of the metal plates 49. The longitudinal ends of each metal plate 49 are flat. Therefore, the metal that corresponds to the metal plates 46 that exist at the portions 47a shown in FIG. 20(a) does not exist in the cooling substrate 51 shown in FIG. 20(b). That is, the proportion of metal having high coefficient of thermal expansion in the cooling substrate 47 shown in FIG. 20(a) is greater than in the case with the cooling substrate 51 shown in FIG. 20(b) by the amount corresponding to the bent portions.

In the case where holes are formed by punching after processing a raw material into flat shape as the substrate for semiconductors shown in FIG. 18, the yield rate decreases, which increases the material cost. Also, forming the holes by precision casting (lost wax) increases the manufacturing cost.

In the process disclosed in Japanese Patent Publication No. 3216305, the difference between the coefficient of thermal expansion of the semiconductor element and the coefficient of thermal expansion of the plate-shaped conductive material is great. Thus, the thermal stress caused by heat generation during operation of the semiconductor might disconnect the wiring of the plate-shaped conductive material.

BRIEF SUMMARY OF THE INVENTION

Accordingly, it is a first objective of the present invention to provide a high-strength inexpensive composite material that has a reliable coefficient of thermal conductivity and is suitable for cooling substrate on which electronic elements, such as semiconductors, are mounted, and a method for manufacturing the composite material. A second objective of the present invention is to provide a composite material that is suitable for wiring material of semiconductors and a method for manufacturing the composite material.

To achieve the above objective, the present invention provides a plate-shaped composite material, which includes a first member and a second member. The first member is an expanded metal made of metal plate. The coefficient of linear expansion of the metal plate is less than or equal to $8 \times 10^{-6}$/degrees Celsius. The second member is formed of metal. The coefficient of thermal conductivity of the metal is greater than or equal to 200 W/(m×K). The first member suppresses thermal expansion of the composite material. The second member maintains the coefficient of thermal conductivity of the composite material.

The present invention also provides another composite material. The composite material includes a plate-shaped conductive member having an end and a plate-shaped expansion suppressing portion located at the end of the conductive member. The expansion suppressing portion includes a first member and a second member. The first member is an expanded metal made of metal plate. The coefficient of linear expansion of the metal plate is less than or equal to $8 \times 10^{-6}$/degrees Celsius. The second member is formed of metal. The coefficient of thermal conductivity of the metal is greater than or equal to 200 W/(m×K). The first member suppresses the thermal expansion of the composite material. The second member maintains the coefficient of thermal conductivity of the composite material.

The present invention also provides another composite material. The composite material includes a plate-shaped conductive member having an end and a plate-shaped expansion suppressing portion located at the end of the conductive member. The expansion suppressing portion includes a first member and a second member. The first member is an expanded metal made of metal plate. The coefficient of linear expansion of the metal plate is less than or equal to $8 \times 10^{-6}$/degrees Celsius. The second member is formed of metal. The coefficient of thermal conductivity of the metal is greater than or equal to 200 W/(m×K). At least one of the conductive member and the second member is filled in meshes of the first member and laminated on the first member.

The present invention also provides another composite material. The composite material includes a plate-shaped conductive member having an end and an expansion suppressing portion located at the end of the conductive member. The expansion suppressing portion includes a plate-shaped insulation member and an expanded metal made of a metal plate. The coefficient of linear expansion of the metal plate is less than or equal to $8 \times 10^{-6}$/degrees Celsius. Part of the conductive member is filled in meshes of the expanded metal.

The present invention also provides a manufacturing method of a composite material. The method being characterized by: forming a first member from an expanded metal made of a metal plate, wherein the coefficient of linear expansion of the metal plate is less than or equal to $8 \times 10^{-6}$/degrees Celsius; and surrounding the first member with a second member, wherein the second member is made of metal, and wherein the coefficient of thermal conductivity of the metal is greater than or equal to 200 W/(m×K).

The present invention also provides another manufacturing method of a composite material. The method being characterized by: laminating an expanded metal and a rubber sheet at an end of a plate-shaped conductive member, wherein the expanded metal is formed of a metal plate, wherein the coefficient of linear expansion of the metal plate is less than or equal to $8 \times 10^{-6}$/degrees Celsius, and wherein the expanded metal suppresses thermal expansion of the composite material; applying pressure to the rubber sheet and filling the conductive member and the rubber sheet in meshes of the expanded metal; and surrounding the expanded metal with a metal to maintain the coefficient of thermal conductivity of the composite material, wherein the coefficient of thermal conductivity of the metal is greater than or equal to 200 W/(m×K).

BRIEF DESCRIPTION OF THE DRAWINGS

FIG. 13(a) is a schematic side view illustrating a state where the composite material of FIG. 12 is being used as the wiring material;

FIG. 13(b) is a side view illustrating a state where the wiring material shown in FIG. 13(a) is located on a pad of the semiconductor;

FIG. 13(c) is a cross-sectional view illustrating the wiring material shown in FIG. 13(a);

FIG. 13(d) is a schematic cross-sectional view illustrating the composite material shown in FIG. 12;

FIG. 14 is a schematic cross-sectional view illustrating a manufacturing method of a composite material according to a modified embodiment;

FIG. 15(a) is a schematic cross-sectional view illustrating a composite material according to another modified embodiment;

FIG. 15(b) is a schematic cross-sectional view illustrating a composite material according to another modified embodiment;

FIG. 17(a) is a schematic cross-sectional view illustrating a cooling substrate according to a prior art in a state where a pair of metal plates are laid on each other with a wire fabric arranged in between;

FIG. 18 is a plan view illustrating a base material of a substrate for semiconductors according to another prior art;

FIG. 19 is an enlarged partial view of FIG. 17(b);

FIG. 20(a) is a schematic cross-sectional view illustrating the cooling substrate shown in FIG. 17(b); and FIG. 20(b) is a schematic cross-sectional view illustrating a cooling substrate according to another prior art.

DETAILED DESCRIPTION OF THE PREFERRED EMBODIMENTS

A first embodiment of the present invention will now be described with reference to FIGS. 1(a) to 3.

FIGS. 1(a) and 1(b) show a composite material 11. The composite material 11 includes a first member, which is an expanded metal 12 in the first embodiment, and a second member, which is a matrix metal 13 in the first embodiment. The matrix metal 13 surrounds the expanded metal 12. The expanded metal 12 is formed of a metal plate the coefficient of linear expansion of which is less than or equal to $8 \times 10^{-6}$/degrees Celsius. In the first embodiment, the expanded metal 12 is made of invar, which is an Fe and Ni based alloy including 36% Ni by weight. The matrix metal 13 is a metal (copper is used in the first embodiment) the coefficient of thermal conductivity of which is greater than or equal to 200 W/(m×K). The expanded metal is formed by stretching a piece of metal plate having slits. The slits are expanded to form a wire fabric. As can be seen in FIG. 1(a), the expanded metal thus has two series of bisecting parallel strands defining a plurality of diamond-shaped meshes. Furthermore, the expanded metal may be flat such that the strands are all in the same plane.

Figure 2:
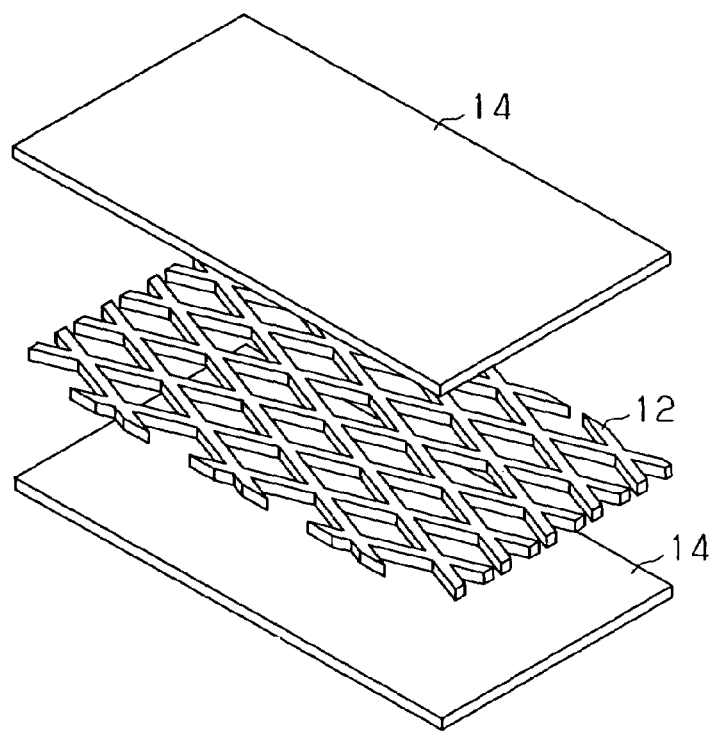
FIG. 2 is a schematic perspective view illustrating metal plates and an expanded metal, which constitute the composite material.
Figure 3:
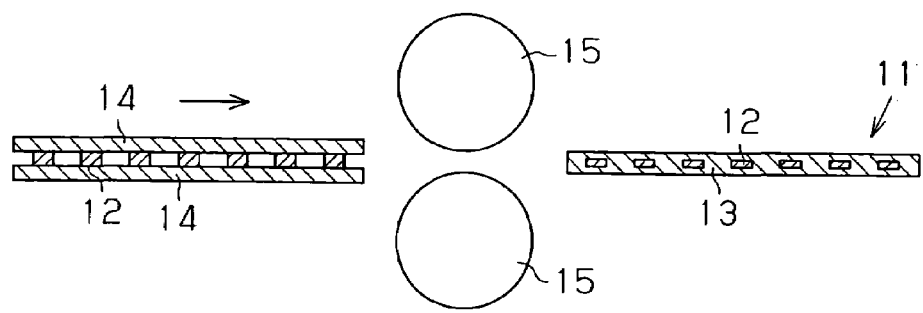
FIG. 3 is a schematic cross-sectional view illustrating a manufacturing method of the composite material of FIG. 1.

A manufacturing method of the composite material 11 will now be described with reference to FIGS. 2 and 3. As shown in FIG. 2, the expanded metal 12 is arranged between a pair of metal plates 14 made of copper. The expanded metal 12 and the metal plates 14 are then rolled and joined with each other to form the composite material 11. More specifically, as shown in FIG. 3, the metal plates 14 and the expanded metal 12, which is arranged between the metal plates 14, are heated and rolled by a pair of rollers 15. As a result, the metal plates 14 and the expanded metal 12 are integrated into the composite material 11. In this case, the heating temperature is set such that the metal plates 14 will not melt.

The coefficient of linear expansion and the coefficient of thermal conductivity of the composite material 11 are determined by adjusting the size of the meshes of the expanded metal 12 or by adjusting the thickness of the metal plate 14. The composite material 11 is manufactured in accordance with the intended purpose such that the coefficient of linear expansion is approximately $5 \times 10^{-6}$ to $15 \times 10^{-6}$/degrees Celsius.

The composite material 11 is used as a cooling substrate, on which semiconductors are mounted. The composite material 11 may be used as a heat sink.

The first embodiment provides the following advantages.

(1) The expanded metal 12 is formed of the metal plate, the coefficient of linear expansion of which is less than or equal to $8 \times 10^{-6}$/degrees Celsius, so as to suppress thermal expansion. The expanded metal 12 is then surrounded by the metal, the coefficient of thermal conductivity of which is greater than or equal to 200 W/(m×K), so as to maintain the coefficient of thermal conductivity. The expanded metal 12 and the metal are combined to form the composite material 11. Therefore, the composite material 11 has the coefficient of linear expansion and the coefficient of thermal conductivity that are suitable for the cooling substrate, on which electronic element such as semiconductors are mounted. Since the expanded metal 12 is used, the composite material 11 has superior heat conductivity and strength as compared to a case where a wire fabric is used. Also, the manufacturing cost is reduced as compared to a case where holes are formed in a flat metal plate by precision casting or punching.

(2) The expanded metal 12 is surrounded by the metal (matrix metal 13), the coefficient of thermal conductivity of which is greater than or equal to 200 W/(m×K), to form the composite material 11. Therefore, the coefficient of thermal conductivity in the horizontal direction is improved as compared to a structure in which part of the expanded metal 12 is exposed at the surface of the composite material.

(3) In contrast to using the wire fabric, spaces are not easily formed between the expanded metal 12 and the matrix metal 13. Thus, the heat conductivity and the strength are improved as compared to when the wire fabric is used. Also, the manufacturing cost is reduced as compared to the case where holes are formed on a metal plate by precision casting or punching.

(4) The expanded metal 12 is made of invar, the coefficient of linear expansion of which is approximately $1 \times 10^{-6}$/degrees Celsius. Therefore, it is easy to obtain the composite material 11 having the coefficient of linear expansion suitable for the cooling substrate that is used for mounting electronic elements, such as semiconductors.

(5) The expanded metal 12 is rolled and joined while being held between the metal plates 14, the coefficient of thermal conductivity of which is greater than or equal to 200 W/(m×K). Therefore, the composite material 11 is manufactured without increasing the temperature as high as to melt the matrix metal. Thus, the manufacturing cost is reduced.

(6) Copper is used as the metal, the coefficient of thermal conductivity of which is greater than or equal to 200 W/(m×K). The coefficient of thermal conductivity of the copper is 390 W/(m×K), which is relatively high. The copper is less expensive as compared to precious metals, but the copper improves the cooling performance of the composite material 11.

A manufacturing method of a composite material 111 according to a second embodiment of the present invention will now be described with reference to FIG. 4. Among the method for manufacturing the composite material 111, the method for forming a matrix metal 13 differs from that of the first embodiment shown in FIGS. 1 to 3. Like or the same reference numerals are given to those components that are like or the same as the corresponding components of the embodiment of FIGS. 1 to 3 and detailed explanations are omitted.

Figure 4A:
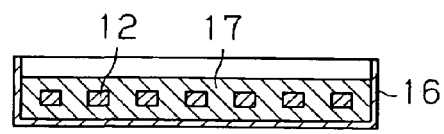
FIG. 4(a) is a schematic cross-sectional view illustrating a manufacturing method of a composite material according to a second embodiment of the present invention.
Figure 4B:
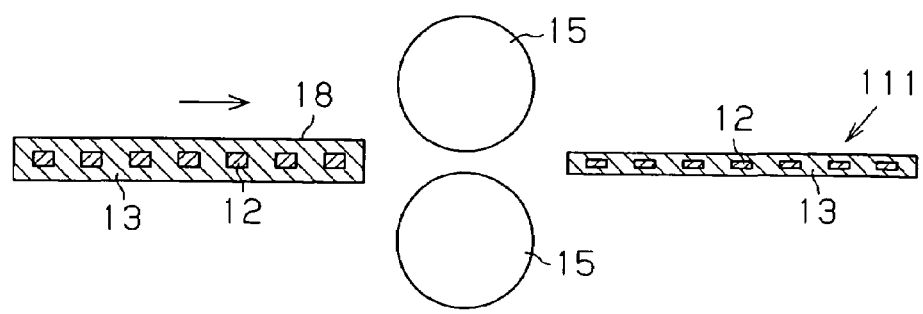
FIG. 4(b) is a schematic cross-sectional view illustrating the manufacturing method of the composite material shown in FIG. 4(a)

As shown in FIG. 4(a), the expanded metal 12 is arranged in a mold 16. Then, a molten metal 17, which is copper in this embodiment, is poured into the mold 16. As shown in FIG. 4(b), a molded body 18 is rolled by the rollers 15 to a predetermined thickness to form the composite material 111. The molded body 18 is removed from the mold 16 while the temperature of the molded body 18 is considerably high, or before the molded body 18 is completely cooled. In this case, the molded body 18 need not be heated when rolled by the rollers 15.

Figure 1:
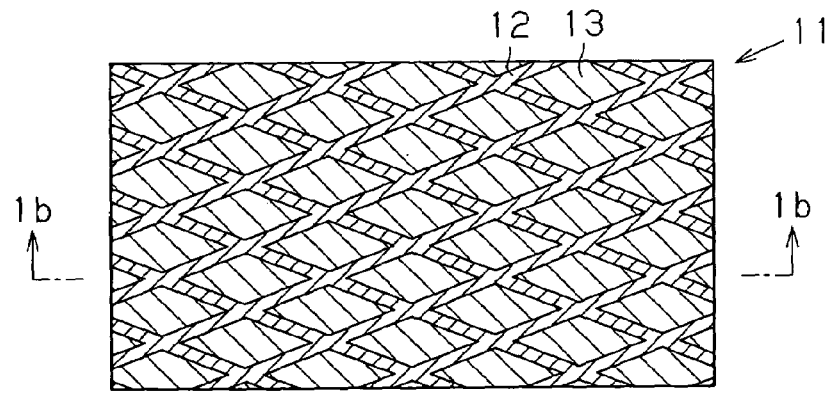
FIG. 1(a) is a schematic cross-sectional view illustrating a composite material according to a first embodiment of the present invention.
FIG. 1(b) is a cross-sectional view taken along line 1b—1b in FIG. 1(a)
Figure 1:

The second embodiment provides the following advantages in addition to the advantages (1) to (4), and (6) of the first embodiment shown in FIGS. 1 to 3.

(7) The molten metal 17 is poured into the mold 16, in which the expanded metal 12 is arranged, to form the molded body 18. The molded body 18 is then rolled. Therefore, the matrix metal 13 easily surrounds and adheres to the expanded metal 12.

(8) The rollers are only required to adjust the thickness of the molded body 18 and need not join the metal plates 14. Thus, the pressure of the rollers need not be great.

A composite material 211 according to a third embodiment will now be described with reference to FIGS. 5(a) to 7. The composite material 211 of the third embodiment differs from the embodiments of FIGS. 1 to 4(b) in that several expanded metals 12 are used and parts of the expanded metals 12 are exposed on the surfaces of the composite material 211. Like or the same reference numerals are given to those components that are like or the same as the corresponding components of the embodiments of FIGS. 1 to 4(b) and detailed explanations are omitted.

Figure 5A:
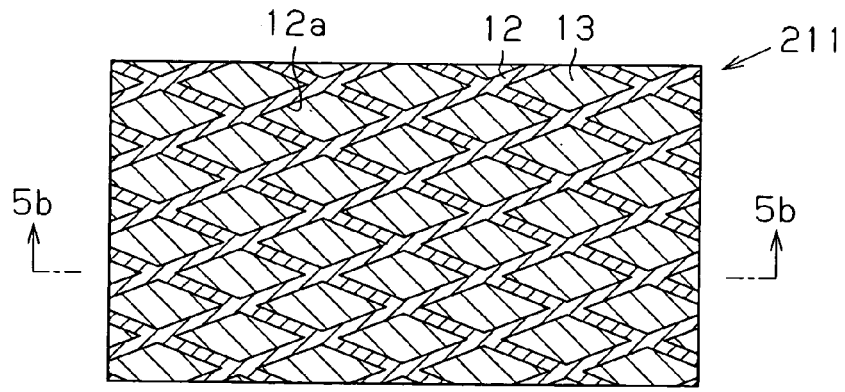
FIG. 5(a) is a schematic cross-sectional view illustrating a composite material according to a third embodiment.
Figure 5B:
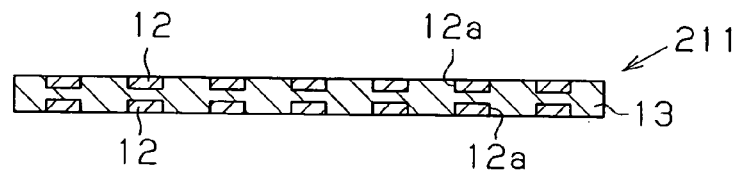
FIG. 5(b) is a schematic cross-sectional view taken along line 5b—5b in FIG. 5(a)

As shown in FIGS. 5(a) and 5(b), the composite material 211 includes several expanded metals 12 (two are provided in the third embodiment) and the matrix metal 13. The expanded metals 12 are located on the front and rear surfaces of the composite material 211, and the matrix metal 13 is located between the expanded metals 12 and in meshes 12a of the expanded metals 12.

Figure 6:
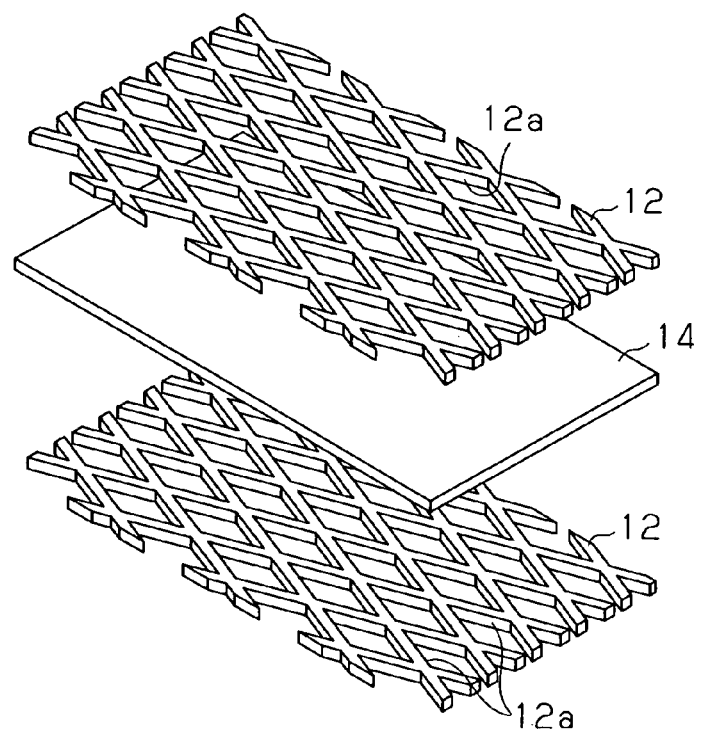
FIG. 6 is a schematic perspective view illustrating metal plates and an expanded metal forming the composite material shown in FIG. 5(a)
Figure 7:
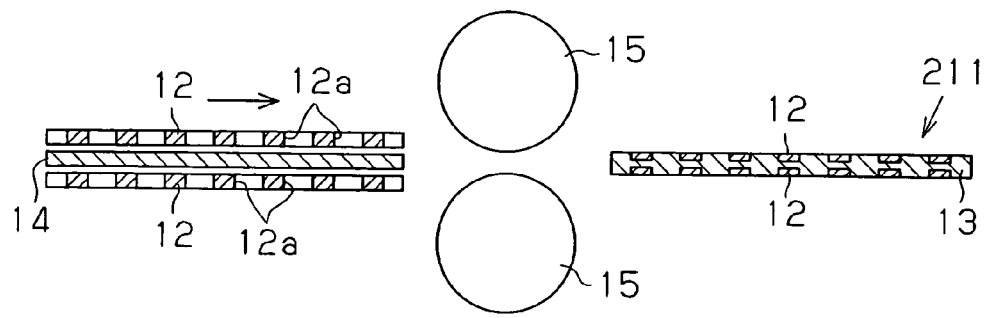
FIG. 7 is a schematic cross-sectional view illustrating a manufacturing method of the composite material shown in FIG. 5(a)

A method for manufacturing the composite material 211 constituted as described above will be described with reference to FIGS. 6 and 7. In the manufacturing method of the third embodiment, as shown in FIG. 6, the metal plate 14 made of copper is rolled and joined while being held between two expanded metals 12 to form the composite material 211. That is, as shown in FIG. 7, the metal plate 14 is heated and rolled with the rollers 15 while being arranged between two expanded metals 12. Therefore, metal forming the metal plate 14 enters the meshes 12a of the expanded metals 12. After being pressed by the rollers 15, the matrix metal 13 is integrated with the expanded metals 12 to form the composite material 211 in a state in which the matrix metal 13 is located between two expanded metals 12 and in the meshes 12a. The temperature is set not to be as high as to melt the matrix metal 14.

The third embodiment provides the following advantages in addition to the advantages (1), (3), (4), and (6) of the first embodiment of FIGS. 1 to 3.

(9) Since the expanded metals 12 are exposed on the front and rear surfaces of the composite material 211, the thermal expansion at the vicinity of the front and rear surfaces of the composite material 211 is more effectively suppressed as compared to a case where the entire expanded metal 12 is surrounded by the metal, the coefficient of thermal conductivity of which is greater than or equal to 200 W/(m×K).

(10) When manufacturing the expanded metal 12, the thinner the expanded metal 12 is the easier the fine mesh 12a is made. Therefore, when the volume ratio of the expanded metal 12 and the matrix metal 13 is the same, the structure in which several expanded metals 12 are used permits the meshes 12a to be easily made small as compared to a structure in which one expanded metal 12 is used. As a result, the composite material 211 that has uniform quality is easily obtained.

A composite material 221 according to a fourth embodiment will now be described with reference to FIGS. 8(a) to 11. The composite material 221 of the fourth embodiment differs from the embodiments of FIGS. 1 to 7 in that the composite material 221 is formed to be suitable for wiring material of semiconductors.

Figure 8A:
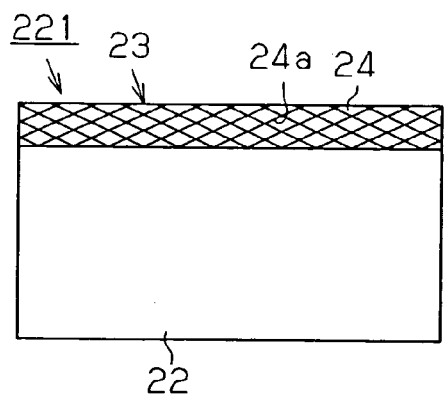
FIG. 8(a) is a schematic plan view illustrating a composite material according to a fourth embodiment.
Figure 8B:
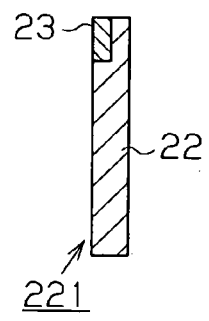
FIG. 8(b) is a schematic cross-sectional view of FIG. 8(a)
Figure 8C:
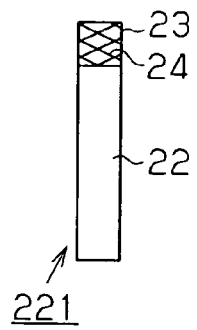
FIG. 8(c) is a schematic plan view illustrating the composite material of FIG. 8(a) cut into the size of a wiring material.

As shown in FIGS. 8(a) to 8(c), the composite material 221 includes a plate-shaped conductive member 22 and an expansion suppressing portion 23, which is located at the end of the conductive member 22. The conductive member 22 is a copper foil. The thickness of the copper foil is formed to be, for example, some μm to 300 μm, or more preferably, some μm to some tens of μm depending on the conditions of usage.

The expansion suppressing portion 23 includes a first member, which is an expanded metal 24, and a second member, which is a metal the coefficient of thermal conductivity of which is greater than or equal to 200 W/(m×K). The expanded metal 24 is formed by a metal plate, the coefficient of linear expansion of which is less than or equal to $8 \times 10^{-6}$/degrees Celsius. The second member is filled in the mesh of the expanded metal 24. The expanded metal 24 suppresses the thermal expansion and the metal filled in the mesh maintains the coefficient of thermal conductivity. Copper, which is the same material as the conductive member 22, is used for the metal, the coefficient of thermal conductivity of which is greater than or equal to 200 W/(m×K). The expanded metal 24 is made of invar.

The composite material 221 may be formed into a shape of wiring material from the beginning (for example, the shape shown in FIG. 8(c)). More preferably, as shown in FIG. 8(a), the composite material 221 is formed into a shape in which units that are used as wiring material are integrated as one body. The composite material 221 is then cut into a predetermined width to be used. In this case, the composite material 221 is preferable in the aspects of productivity, storage, and handling performance.

Figure 9:
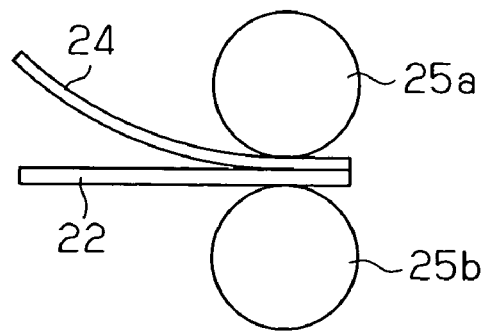
FIG. 9 is a schematic side view illustrating a manufacturing method of the composite material shown in FIG. 8(a)

The composite material 221 is manufactured by performing resistance welding while crimping the plate-shaped expanded metal 24 of a predetermined size to the end of the plate-shaped conductive member 22 of a predetermined size. For example, as shown in FIG. 9, seam welding is used in a suitable manner. In this case, welding is performed linearly while rotating a pair of disk-like welding electrodes 25a, 25b, which are able to apply pressure and conduct electricity. In the method shown in FIG. 9, resistance welding is performed when a portion where the conductive member 22 overlaps the expanded metal 24 passes between the welding electrodes 25a and 25b. As a result, the conductive member 22 and the expanded metal 24 are joined with each other with part of the conductive member 22 filled in the mesh 24a of the expanded metal 24. Accordingly, the composite material 221, which has the expansion suppressing portion 23 at the end of the conductive material 22, is manufactured.

Figure 10:
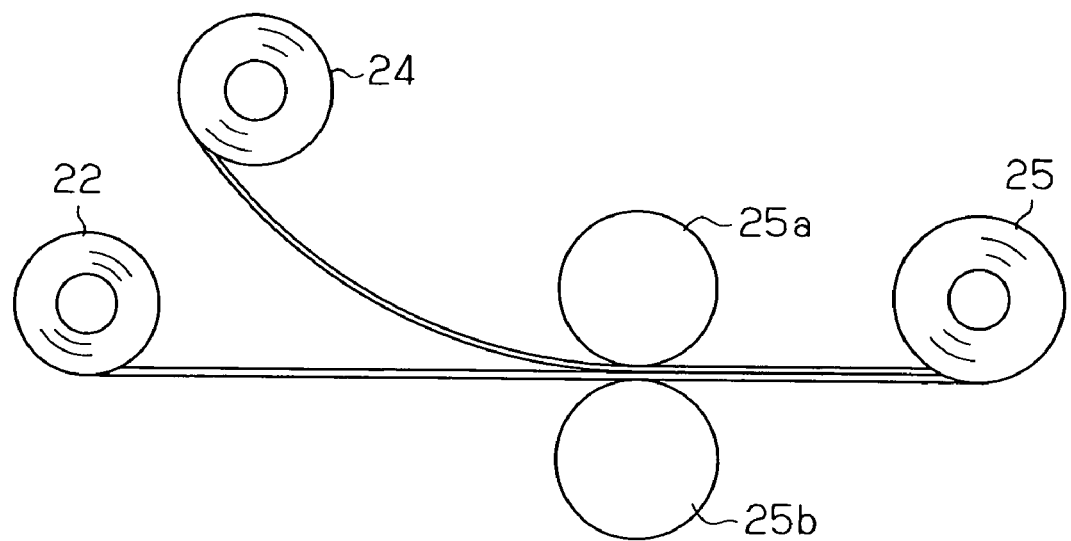
FIG. 10 is a schematic side view illustrating a manufacturing method different from the manufacturing method shown in FIG. 9.

Instead of performing seam welding at the overlapped portion of the plate-shaped conductive member 22 and the expanded metal 24, the conductive member 22 that is wound into a coil and the expanded metal 24 that is also wound into a coil may be used. The composite material 221 welded through the welding electrodes 25a and 25b may then be wound into a coil as shown in FIG. 10. In this case, the productivity is increased and handling of the composite material 221 is facilitated as compared to a case where the plate-shaped conductive member 22 and the expanded metal 24 are used to manufacture the composite material 221.

Figure 11:
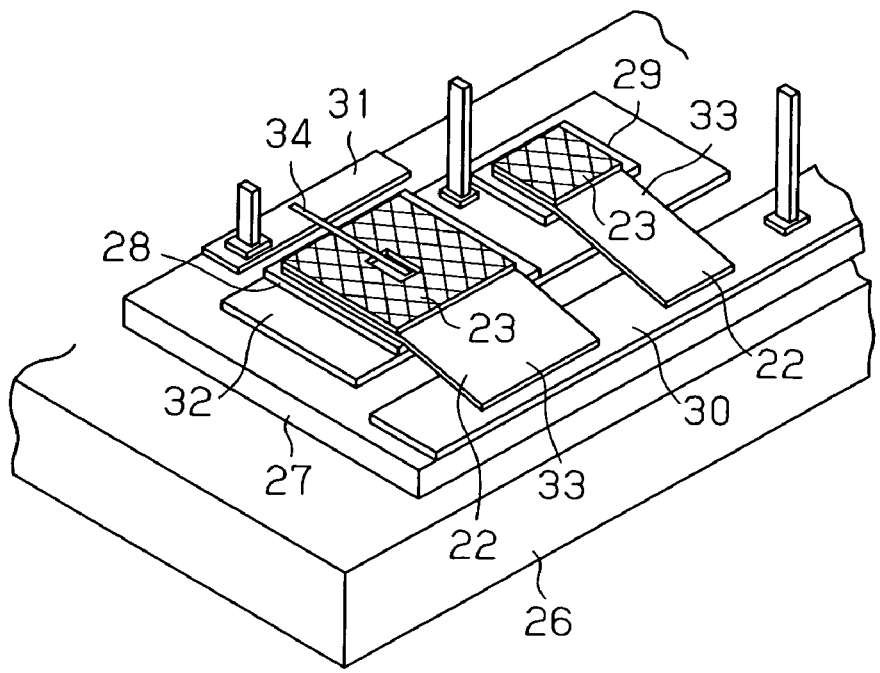
FIG. 11 is a schematic perspective view illustrating the wiring material in a state in which the wiring material is being used.

The composite material 221 is, for example, used as a wiring material 33 of a semiconductor in a suitable manner as shown in FIG. 11. FIG. 11 is a partial schematic perspective view of an IGBT (insulated gate bipolar transistor) module constituting the semiconductor. An insulating plate 27 is secured to a heat sink 26. An IGBT element 28 and a diode element 29 are mounted on the insulating plate 27. An emitter electrode 30, a gate electrode 31, and a collector electrode 32 are also located on the insulating plate 27. An emitter pad of the IGBT element 28, which serves as the semiconductor element, is connected to one end of the wiring material 33 by diffusion bonding. The other end of the wiring material 33 is connected to an emitter electrode 30. The expansion suppressing portion 23 is formed to have substantially the same size as the IGBT element 28. With regard to the composite material 221, which is used as the wiring material 33, the end of the composite material 221 close to the expansion suppressing portion 23 corresponds to the emitter pad, and the conductive member 22 is joined to the emitter pad. A hole is formed in the wiring material 33 at a portion corresponding to a gate pad of the IGBT element 28. The gate pad is connected to the gate electrode 31 with a wire 34.

The diode element 29 and the emitter electrode 30 are connected to each other with the wiring material 33. The expansion suppressing portion 23 is formed to have substantially the same size as the diode element 29. The end of the wiring material 33 that is close the expansion suppressing portion 23 corresponds to the diode element 29, and the conductive member 22 is joined to the diode element 29.

To facilitate illustration, the composite material 221 shown in FIGS. 8(a) to 8(c) and the wiring material 33 (composite material 221) shown in FIG. 11 are drawn with different area ratio between the conductive member 22 and the expansion suppressing portion 23. The thicknesses of the conductive member 22 and the expansion suppressing portion 23 are also exaggerated.

The fourth embodiment provides the following advantages.

(11) The bonding pad of the semiconductor element or the semiconductor element is connected to the electrode (emitter electrode 30) with the plate-shaped wiring material 33. Therefore, the pad or the semiconductor element is joined to the electrode in a manner that does not apply great stress on the pad or the semiconductor element. Thus, the element is prevented from being damaged. This improves the cooling performance of the wiring material 33 as compared to wires, and reduces the thermal stress applied to the joint portion, which prevents deterioration of the joint portion.

(12) The expansion suppressing portion 23 is formed at a portion of the wiring material 33 that corresponds to the semiconductor element, which has a small thermal expansion. Therefore, the thermal expansion of the conductive member 22 at the above portion is suppressed, which suppresses damages on the wiring material 33 or the semiconductor element due to the heat generated during operation of the semiconductor.

(13) The expansion suppressing portion 23 includes the expanded metal 24, which is formed by a metal plate the coefficient of linear expansion of which is less than or equal to $8 \times 10^{-6}$/degrees Celsius, and the metal the coefficient of thermal conductivity of which is greater than or equal to 200 W/(m×K) filled in the mesh 24a of the expanded metal 24. Therefore, the expansion suppressing portion 23 also has high cooling performance.

(14) The composite material 221 is formed into a shape in which several units used as the wiring material 33 are integrated. The composite material 221 is then cut into the predetermined width when used as the wiring material 33. Therefore, the composite material 221 is preferable in the aspects of productivity, storage, and handling performance. Also, the manufacturing cost is reduced as compared to a case where the composite material 221 is manufactured to have the size of the wiring material 33 from the beginning.

(15) The composite material 221 is manufactured by performing resistance welding, or more preferably, seam welding, with the conductive member 22 overlapped with the expanded metal 24.

(16) When the composite material 221 is manufactured continuously by seam welding using the conductive member 22 that is wound into a coil and the expanded metal 24 that is wound into a coil, the productivity is increased and the handling is facilitated.

A composite material 321 according to a fifth embodiment will now be described with reference to FIGS. 12 to 13(d). The composite material 321 of the fifth embodiment is the same as the composite material 221 of the fourth embodiment shown in FIGS. 8(a) to 11 in that the composite material 321 is used as the wiring material in a suitable manner. However, the composite material 321 of the fifth embodiment differs from the composite material 221 of the fourth embodiment shown in FIGS. 8(a) to 11 in that an insulation member 35 is laminated on the expansion suppressing portion 23. Like or the same reference numerals are given to those components that are like or the same as the corresponding components of the fourth embodiment of FIGS. 8(a) to 11 and detailed explanations are omitted.

Figure 12:
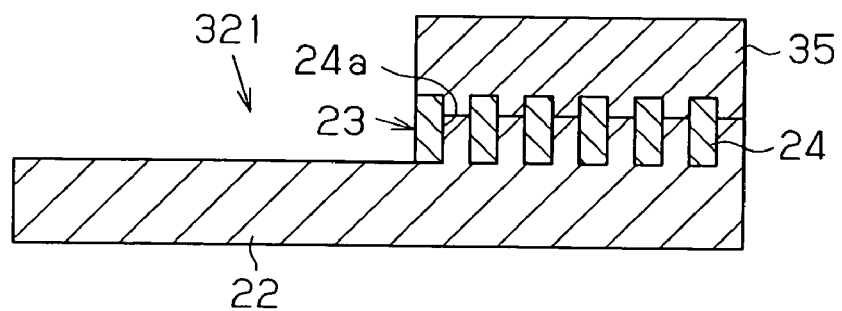
FIG. 12 is a schematic cross-sectional view illustrating a composite material according to a fifth embodiment.
Figure 16:
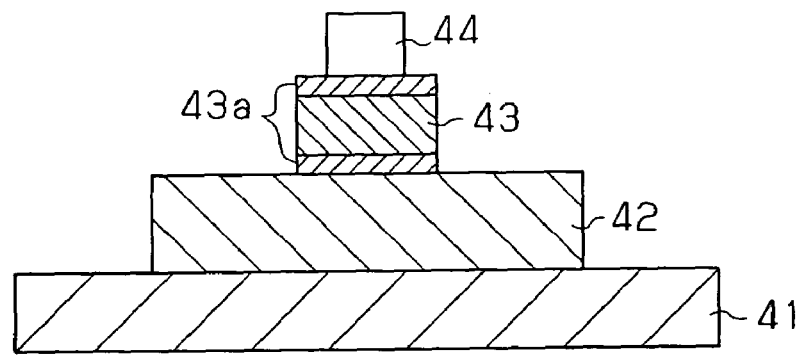
FIG. 16 is a schematic cross-sectional view illustrating a packaging module using a heat sink according to a prior art.
Figure 17A:
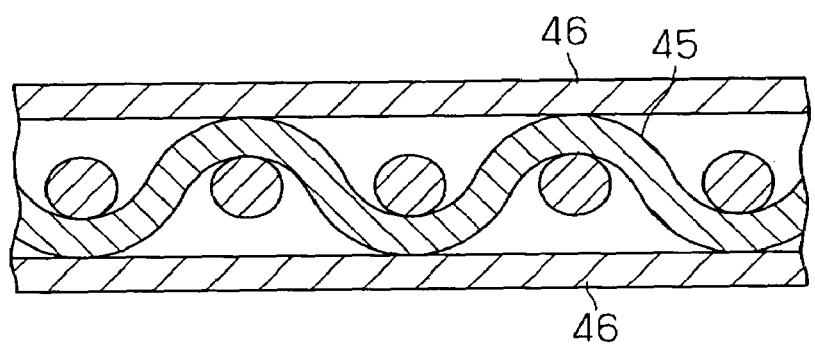
Figure 17B:
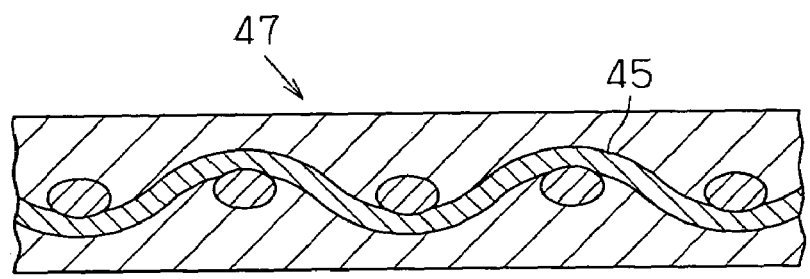
FIG. 17(b) is a cross-sectional view illustrating the cooling substrate with the metal plates and the wire fabric shown in FIG. 17(a) being integrated.

As shown in FIG. 12, the composite material 321 includes the conductive member 22, the expansion suppressing portion 23, and the insulation member 35. The insulation member 35 is made of rubber in the fifth embodiment, and silicon rubber is used as the rubber. The composite material 321 is manufactured by arranging the expanded metal 24 and the insulation member 35 on the end of the plate-shaped conductive member 22 in layer, and applying pressure on the side of the insulation member 35. When the insulation member 35 is pressurized, the material of the conductive member 22 and the insulation member 35 are filled in the mesh 24a of the expanded metal 24. As a result, the conductive member 22, the expansion suppressing portion 23, and the insulation member 35 are integrated.

The composite material 321 is formed into a shape in which several units used as the wiring material are integrated. In addition to a structure in which the composite material 321 is cut into the predetermined width to be used, the composite material 321 may be manufactured to be the wiring member during wiring. For example, as shown in FIG. 13(a), the expanded metal 24 and the insulation member 35, which are formed into a predetermined size, are laminated on the end of the conductive member 22, which is formed into the size of the wiring material. The expanded metal 24 and the insulation member 35 are temporarily secured to the conductive member 22 with a small amount of adhesive. The end of the wiring material on which the expanded metal 24 is located is arranged on a pad 36 of the semiconductor element to be joined as shown in FIG. 13(b). In this state, pressure and ultrasonic wave are applied from the side of the insulation member 35. As a result, the conductive member 22 is joined with the pad 36. The conductive member 22 and the insulation member 35 are also joined with the expanded metal 24 with part of the conductive member 22 being filled in the mesh 24a of the expanded metal 24 and part of the insulation member 35 being filled in the mesh 24a of the expanded metal 24. As a result, the expansion suppressing portion 23 is joined to the end of the conductive member 22, and the insulation member 35 is joined on the expansion suppressing portion 23 to form the composite material 321. FIG. 13(c) is a cross-sectional view of FIG. 13(a), and FIG. 13(d) is a cross-sectional view of the composite material 321.

The fifth embodiment provides the following advantages in addition to the advantages (11) and (12) of the fourth embodiment shown in FIGS. 8(a) to 11.

(17) The composite material 321 is formed utilizing great load applied to the wiring material when joining the wiring material to the semiconductor element. Therefore, as compared to a case where the composite material 321 that is manufactured in advance is used as the wiring material, the energy required for manufacturing the composite material 321 is reduced. Also, the manufacturing cost is further reduced since the composite material 321 is formed at the room temperature.

(18) The insulation member 35 is joined to the conductive member 22 via the expanded metal 24 such that the insulation member 35 faces the conductive member 22 of the expansion suppressing portion 23. Therefore, means for retaining the insulation of the wiring material is not particularly required when joining the wiring material with the semiconductor element. This facilitates the procedure.

(18) Since the insulation member 35 is made of rubber, shock is not easily applied to the expansion suppressing portion 23. Also, since silicon rubber is used as the rubber, the insulation member 35 has superior heat resistance and does not deteriorate easily by the heat generated during operation of the semiconductor.

(20) Since the insulation member 35 is made of silicon rubber and is pressed against the conductive member 22 that is filled in the mesh 24a, the cooling performance of the expansion suppressing portion 23 is maintained.

It should be apparent to those skilled in the art that the present invention may be embodied in many other specific forms without departing from the spirit or scope of the invention. Particularly, it should be understood that the invention may be embodied in the following forms.

As shown in FIG. 14, the expanded metal 12 that is formed into the thickness of the product may be arranged in a mold 416 having a cavity the shape of which corresponds to the composite material 411 as a product. The molten metal 17 may then be poured into the mold 416 to manufacture the composite material 411. In this case, the composite material 411 is manufactured without the rolling, which facilitates the manufacturing of the composite material 411. A predetermined pressure may be applied after pouring the molten metal into the mold 416. In this case, the molten metal 17 easily enters the opening portions even though the expanded metal 12 has small opening portions.

Instead of arranging the expanded metal 12 in the mold 16, 416 and pouring the molten metal 17 into the mold 16, 416, the expanded metal 12 may be soaked in a metal bath. In this case, after being removed from the metal bath, the expanded metal 12 is rolled to form the composite material. Alternatively, instead of being rolled, the expanded metal 12 may be externally machined to form the composite material.

In the third embodiment shown in FIGS. 5(a) to 7, three or more expanded metals 12 may be used. In this case, the matrix metal 13 exists between the expanded metals 12 and in the mesh 12a of each expanded metal 12. With the structure in which several expanded metals 12 are used, the thickness of each expanded metal 12 can be made thin as compared to a case where one expanded metal 12 is used when the volume ratio of the expanded metal 12 to the entire volume of the composite material 211 is the same. As a result, the fine mesh 12a is easily formed and the composite material 211 that has uniform quality is easily manufactured.

The composite material 11 of FIG. 1(b) and the composite material 111 of FIG. 4(b) may use several expanded metals 12.

In the structure in which several expanded metals 12 are used, the expanded metals 12 need not be made of the same material. However, the expanded metals 12 that are arranged symmetrical with respect to the surface that lies along the center of each composite material 11, 111, 211 of FIGS. 1(a) to 7 in the width direction are preferably made of the same material. In this state, generation of warp on each composite material 11, 111, 211 is suppressed even if the coefficient of thermal expansion differs due to the difference of materials. The temperature is set not be as high as to melt the matrix metal 14.

The composite material 221 of FIGS. 8(a) to 8(c) and the composite material 321 of FIG. 12, which are suitable for the wiring material, need not have a structure in which part of the conductive member 22 is filled in the mesh 24a of the expanded metal 24 with application of pressure. Instead, the expansion suppressing portion 23 may be formed with the composite material in which metal having high thermal conductivity is filled in the mesh 24a of the expanded metal in advance. Then, the composite material may be joined to the end of the conductive member 22. As a composite material 421 shown in FIG. 15(a), the expansion suppressing portion 23 may be joined to the conductive member 22, and a metal plate 37 the coefficient of thermal conductivity of which is greater than or equal to 200 W/(m×K) may be joined to a position opposite to the conductive member 22 with respect to the expansion suppressing portion 23. Further, as a composite material 521 shown in FIG. 15(b), only the expansion suppressing portion 23 may be joined to the conductive member 22.

The metal plate 37 shown in FIG. 15(a) may be formed of metal that is the same as the conductive member 22 or different metal. The metal that is filled in the mesh 24a of the expanded metal 24 may also be the same as the conductive member 22 or different metal. A preferable metal other than copper is aluminum.

When manufacturing the composite material 221 of FIGS. 8(a) to 8(c) by seam welding, one of the electrodes may be plate-shaped, and the overlapped portion of the conductive member 22 and the expansion suppressing portion 23 may be located on the plate-shaped electrode. Then, the conductive member 22 and the expansion suppressing portion 23 may be joined by rotating and shifting a disk-like welding electrode.

For the manufacturing method of the composite material 221 of FIGS. 8(a) to 8(c), press molding, such as hot press molding and cold press molding, or a rolling method may be employed.

The insulation member 35 may be made of resin.

In the fifth embodiment of FIGS. 12 to 13(d), pressure is applied while temporarily securing the conductive member 22, the expanded metal 24, and the insulation member 35 with adhesive. Instead, the conductive member 22 and the expanded metal 24 may be temporarily secured with adhesive, and the insulation member 35 may be located on the adhered conductive member 22 and the expanded metal 24. Then, pressure may be applied to the insulation member 35.

The matrix metal 13 may be a metal the coefficient of thermal conductivity of which is greater than or equal to 200 W/(m×K). For example, aluminum based metal or silver may be used. The aluminum based metal refers to aluminum and aluminum alloy. The coefficient of thermal conductivity of the aluminum based metal is low as compared to that of the copper. The melting point of the aluminum based metal (aluminum) is 660 degrees Celsius, which is significantly lower than the melting point of the copper, which is 1085 degrees Celsius. Thus, the melting temperature of the metal is decreased. This results in the reduction of the manufacturing cost as compared to the copper. Aluminum based metal is also preferable in view of weight reduction.

The expanded metal 12 may be formed of any metal the coefficient of linear expansion of which is less than or equal to $8 \times 10^{-6}$/degrees Celsius. For example, other invar alloy such as super invar, stainless invar, or fernico, which is an alloy of 54% Fe by weight, 31% Ni by weight, and 15% Co by weight, the coefficient of linear expansion of which is $5 \times 10^{-6}$/degrees Celsius, may be used.

In the manufacturing method of the composite material 11, 111, 211 shown in FIGS. 1(a) to 7, the adhesion process need not be performed. The composite material 11, 111, 211 may be manufactured by heat treatment after cold rolling.

The composite materials 11, 111, 211 may be used as cooling substrate used for purposes other than mounting semiconductors.

The mold 16, 416 may be made of ceramics.

The invention claimed is:

1. A composite material comprising:
    a plate-shaped conductive member having an end and
    an expansion suppressing portion located at the end of the conductive member,
    wherein the expansion suppressing portion includes a plate-shaped insulation member and an expanded metal made of a metal plate,
    wherein the coefficient of linear expansion of the metal plate is less than or equal to $8 \times 10^{-6}$/degrees Celsius, and
    wherein part of the conductive member is filled in meshes of the expanded metal.

2. The composite material according to claim 1, characterized in that the insulation member is made of rubber.

3. The composite material according to claim 1, characterized in that the expanded metal is an invar or an Fe-Ni alloy, which has substantially the same coefficient of linear expansion as the invar.

4. A manufacturing method of a composite material comprising the steps of:
    laminating an expanded metal and a rubber sheet at an end of a plate-shaped conductive member, wherein the expanded metal is formed of a metal plate, wherein the coefficient of linear expansion of the metal plate is less than or equal to $8 \times 10^{-6}$/degrees Celsius, and wherein the expanded metal suppresses thermal expansion of the composite material;
    applying pressure to the rubber sheet, conductive member, and expanded metal, and filling the conductive member and the rubber sheet in meshes of the expanded metal; and
    surrounding the expanded metal with a metal to maintain the coefficient of thermal conductivity of the composite material, wherein the coefficient of thermal conductivity of the metal is greater than or equal to 200 W/(m×K).

* * * * *